(12) United States Patent
Cheng et al.

(10) Patent No.: US 7,876,140 B2
(45) Date of Patent: Jan. 25, 2011

(54) SIGNAL ADJUSTING SYSTEM AND SIGNAL ADJUSTING METHOD

(75) Inventors: Wen-Chang Cheng, Taoyuan (TW); Chuan-Jen Chang, Hsinchu County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 43 days.

(21) Appl. No.: 12/407,760

(22) Filed: Mar. 19, 2009

(65) Prior Publication Data

US 2010/0188127 A1 Jul. 29, 2010

(30) Foreign Application Priority Data

Jan. 23, 2009 (TW) .............................. 98102933 A

(51) Int. Cl.
*H03L 7/00* (2006.01)
(52) U.S. Cl. .................. 327/161; 327/142; 327/153; 375/375
(58) Field of Classification Search .............. 327/141, 327/144–163; 331/15–17; 375/373–376
See application file for complete search history.

(56) References Cited

U.S. PATENT DOCUMENTS

| | | | | |
|---|---|---|---|---|
| 6,486,716 | B1 * | 11/2002 | Minami et al. | 327/152 |
| 7,471,131 | B2 * | 12/2008 | Liu et al. | 327/158 |
| 2007/0176658 | A1 * | 8/2007 | Ishikawa | 327/161 |

* cited by examiner

*Primary Examiner*—Lincoln Donovan
*Assistant Examiner*—Brandon S Cole
(74) *Attorney, Agent, or Firm*—Winston Hsu; Scott Margo

(57) ABSTRACT

A signal adjusting system includes: a signal generating device for generating a plurality of output signals according to a plurality of pre-output signals, a plurality of signal transmitting paths being coupled to the signal generating device for transmitting the plurality of output signals; and a controlling device coupled to the plurality of signal transmitting paths for receiving a first transmitted signal corresponding to a first output signal and a second transmitted signal corresponding to a second output signal, and detecting a phase different between the first transmitted signal and the second transmitted signal to generate a detected result to the signal generating device, wherein the signal generating device adjusts the phase difference between the first output signal and the second output signal according to the detected result.

20 Claims, 2 Drawing Sheets

SIGNAL ADJUSTING SYSTEM AND SIGNAL ADJUSTING METHOD

Background of the Invention

1. Field of the Invention

The present invention relates to a signal adjusting system and related signal adjusting method, and more particularly to an apparatus that reduces phase differences between a plurality of transmitted signals in a double data rate dynamic random access memory system, and a related method.

2. Description of the Prior Art

In a DDR (Double Data Rate) dynamic random access memory (DRAM) system, a DDR dynamic random access memory recognizes a data strobe signal, called a DQS signal, to perform an access/read-out operation, wherein the DQS signal is generated by a memory controller. When the memory controller receives a write-in command, the DQS signal is outputted as a plurality of periodic impulses following a relatively low voltage level signal. The rising edges and the falling edges of the periodic impulses of the DQS signal are utilized to write the data signals DQ, e.g., DQ0, DQ1, DQ2, DQ3 . . . , generated by the memory controller, into the memory cells of the DDR dynamic random access memory, or read-out the data signals DQ from the memory cells of the DDR dynamic random access memory. In addition, the communications of the data signal DQ and the data strobe signal DQS between the memory controller and the DDR dynamic random access memory are accomplished by implementing the transmission paths between the memory controller and the DDR dynamic random access memory. Normally, the transmission paths are implemented in different lengths according to the layout of the memory controller and the DDR dynamic random access memory. When the memory controller reads a plurality of data signals DQ from the DDR dynamic random access memory through a plurality of transmission paths having different lengths, the plurality of data signals DQ may not be received by the memory controller at the same time because of the different lengths of the plurality of transmissions. In addition, when the different times between the plurality of data signals DQ received by the memory controller are larger than a specific time interval, the memory controller may not be able to identify the correct data carried by the plurality of data signals DQ. Therefore, improving the effect caused by the different transmission times between the memory controller and the DDR dynamic random access memory is a significant concern in the DDR dynamic random access memory system.

Summary of the Invention

One of the objectives of the present invention is to provide an apparatus that reduces phase differences between a plurality of transmitted signals in a double data rate dynamic random access memory system, and a related method.

According to an embodiment of the present invention, a signal adjusting system is disclosed. The signal adjusting system comprises a signal generating device, a plurality of signal transmitting paths, and a controlling device. The signal generating device generates a plurality of output signals according to a plurality of pre-output signals respectively, where the plurality of pre-output signals comprise a first pre-output signal and at least one second pre-output signal, and the plurality of output signals comprise a first output signal and at least one second output signal. The plurality of signal transmitting paths is coupled to the signal generating device, and the plurality of signal transmitting paths comprises a first signal transmitting path, at least one second signal transmitting path, and a third signal transmitting path. The first signal transmitting path is utilized for transmitting the first output signal, the second signal transmitting path is utilized for transmitting the second output signal, and the third signal transmitting path is utilized for transmitting at least one detected result. The controlling device is coupled to the plurality of signal transmitting paths for receiving a first transmitted signal corresponding to the first output signal and receiving a second transmitted signal corresponding to the second output signal, and detecting a phase difference between the first transmitted signal and the second transmitted signal to generate the detected result to the signal generating device, wherein the signal generating device adjusts the phase difference between the first output signal and the second output signal according to the detected result.

According to a second embodiment of the present invention, a signal adjusting method is disclosed. The signal adjusting method comprises the steps of: a) generating a plurality of output signals according to a plurality of pre-output signals respectively, where the plurality of pre-output signals comprise a first pre-output signal and at least one second pre-output signal, and the plurality of output signals comprise a first output signal and at least one second output signal; b) providing a plurality of signal transmitting paths, the plurality of signal transmitting paths comprising: a first signal transmitting path, for transmitting the first output signal; at least one second signal transmitting path, for transmitting the second output signal; and a third signal transmitting path, for transmitting at least one detected result; c) receiving a first transmitted signal corresponding to the first output signal and receiving a second transmitted signal corresponding to the second output signal from the first signal transmitting path, and detecting a phase difference between the first transmitted signal and the second transmitted signal to generate the detected result; and d) receiving the detected result from the third signal transmitting path, and adjusting the phase difference between the first output signal and the second output signal according to the detected result.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
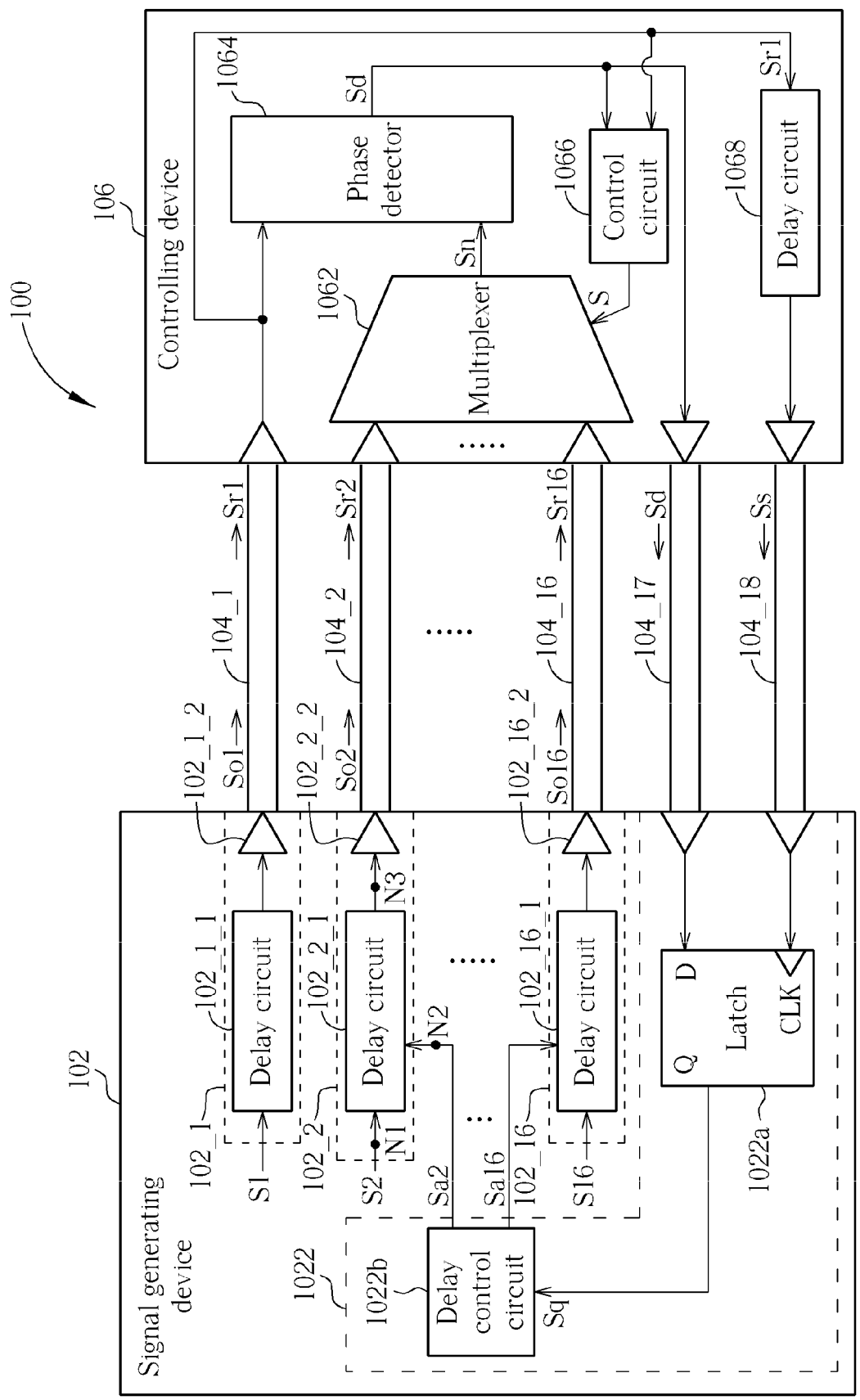
FIG. 1 is a diagram illustrating a signal adjusting system according to an embodiment of the present invention.

Please refer to FIG. 1. FIG. 1 is a diagram illustrating a signal adjusting system 100 according to an embodiment of the present invention. The signal adjusting system 100 comprises a signal generating device 102, a plurality of signal transmitting paths 104_1 -104_16, and a controlling device 106. In this embodiment, the signal generating device 102 is installed in a memory module, and the controlling device 106 is installed in a memory controller. According to the present invention, the signal adjusting system 100 may be in a memory system, such as a DDR (Double Data Rate) dynamic random access memory system. The signal generating device 102 generates a plurality of output signals So1-So16 according to a plurality of pre-output signals S1-S16 respectively. Please note that the plurality of pre-output signals S1-S16 are DQ signals of the memory module. In addition, the plurality of signal transmitting paths 104_1-104_16 are coupled to the signal generating device 102 for generating the plurality of output signals So1-So16 to the controlling device 106 respectively. The controlling device 106 is coupled to the plurality of signal transmitting paths 104_1 -104_16 for receiving a plurality of transmitted signals Sr1-Sr16 respectively, which correspond to the plurality of output signals So1-So16 respectively, and detecting the phase difference between the first transmitted signal Sr1 and other transmitted signals Sr2-Sr16 sequentially to generate a detected result Sd. The signal adjusting system 100 further comprises a signal transmitting path 104_17 and a signal transmitting path 104_18 coupled between the signal generating device 102 and the controlling device 106, wherein the signal transmitting path 104_17 is utilized for transmitting the detected result Sd to the signal generating device 102, and the signal transmitting path 104_18 is utilized for transmitting a triggering signal Ss to the signal generating device 102. Furthermore, the signal generating device 102 adjusts the phase differences between the first output signal So1 and other output signals So2-So16 according to the detected result Sd.

The controlling device 106 comprises a multiplexer 1062, a phase detector 1064, and a control circuit 1066. The multiplexer 1064 is coupled to the signal transmitting paths 104_2-104_16 for selectively outputting one of the transmitted signals Sr2-Sr16 to be a pre-detect output Sn according to a selecting signal S. The phase detector 1064 is coupled to the multiplexer 1062 and the first signal transmitting path 104_1 for detecting the phase difference between the first transmitted signal Sr1 and the pre-detect output Sn to generate the detected result Sd. The control circuit 1066 is coupled between the phase detector 1064 and the multiplexer 1062 for generating the selecting signal S according to at least the output signal of the phase detector 1064. In addition, the controlling device 106 further comprises a delay circuit 1068 coupled to the first signal transmitting path 104_1 for delaying a predetermined delay time Dsyn upon the first transmitted signal Sr1 to generate the triggering signal Ss.

The signal generating device 102 comprises a plurality of delay processing circuits 102_1-102_16 and a setting device 1022, wherein the plurality of delay processing circuits 102_1 -102_16 delay a plurality of delay times D1-D16 upon the plurality of pre-output signals S1-S16 for generating the plurality of output signals So1-So16 respectively. The setting device 1022 is coupled to the delay processing circuits 102_1 -102_16 for selectively adjusting the delay times D2-D16 according to the detected result Sd. The setting device 1022 comprises a latch 1022a and a delay control circuit 1022b. The latch 1022a comprises a data input terminal D coupled to the signal transmitting path 104_17, a clock input terminal coupled to the signal transmitting path 104_18, and an output terminal Q. The delay control circuit 1022b is coupled to the output terminal Q of the latch 1022a and the delay processing circuits 102_2-102_16 for generating the adjusting signals Sa2-Sa16 to selectively adjust the delay times D2-D16 respectively according to the output Sq of the latch 1022a. In addition, in this embodiment, each delay processing circuit of the plurality of delay processing circuits 102_1-102_16 comprises a delay circuit and a driving circuit. The delay processing circuit 102_1, for example, comprises a delay circuit 102_1_1 and a driving circuit 102_1_2 as shown in FIG. 1. Except for the delay processing circuit 102_1, the delay circuit of the other delay processing circuits comprises a first input terminal receiving a pre-output signal, a second input terminal coupled to the setting device, and an output terminal that outputs a delay output signal, where the delay circuit delays a delay time upon the pre-output signal to generate the delay output signal. The driving circuit is coupled to the delay circuit, and the delay circuit comprises an input terminal receiving the delay output signal and an output terminal for generating an output signal. The delay processing circuit 102_2, for example, comprises a first input terminal N1 receiving the pre-output signal S1, a second input terminal N2 coupled to the adjusting signal Sa2 of the setting device 1022b, and an output terminal N3 that outputs a delay output signal Sd2. The driving circuit 102_2_2 is coupled to the delay circuit 102_2_1, and the driving circuit 102_2_1 comprises an input terminal that receives the delay output signal Sd2 and an output terminal that outputs the output signal So2.

Please note that, in this embodiment, the multiplexer 1062 may be a 15-to-1 multiplexer, but this is not meant to be a limitation of the present invention. In other words, any devices capable of selectively outputting one of the transmitted signals Sr2-Sr16 to be the pre-detect output Sn according to the selecting signal S belong to the scope of the present invention. Furthermore, when the phase detector 1064 detects that the phase of the transmitted signal Sr1 leads the phase of the pre-detect output Sn, the detected result Sd is outputted as a high voltage level, i.e., 1. Otherwise, when the phase detector 1064 detects that the phase of the transmitted signal Sr1 lags behind the phase of the pre-detect output Sn, the detected result Sd is outputted as a low voltage level, i.e., 0. Similarly, this is also not meant to be a limitation of the present invention. In addition, the delay circuit 1068 is utilized for delaying the first transmitted signal Sr1 by a predetermined delay time Dsyn in order to synchronize the triggering signal Ss with the detected result Sd. In addition, the present invention does not limit the type of latch 1022a: any latching circuits having the similar characteristic belong to the scope of the present invention. Furthermore, the devices, which are shown as triangular labels coupled to both sides of the plurality of signal transmitting paths 104_1-104_8, are the driving circuit and the receiving circuit respectively. Corresponding detailed descriptions are omitted here for brevity.

Figure 2:
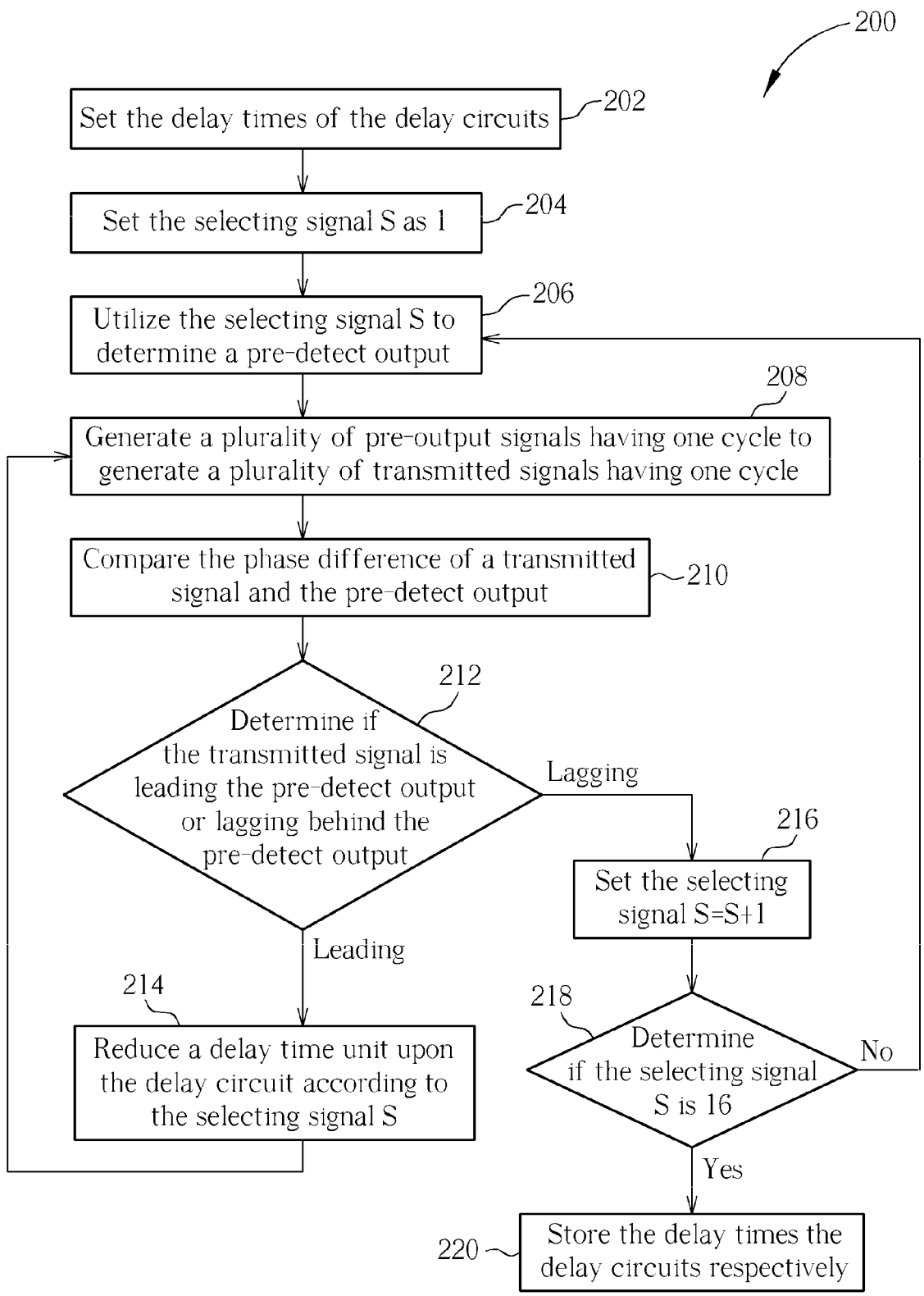
FIG. 2 is a diagram illustrating a signal adjusting method according to a second embodiment of the present invention.

Please refer to FIG. 2. FIG. 2 is a diagram illustrating a signal adjusting method 200 according to a second embodiment of the present invention. Please note that the second embodiment signal adjusting method 200 may be implemented by the signal adjusting system 100. Therefore, the disclosure corresponding to the signal adjusting method 200 is described in conjunction with the signal adjusting system 100 for brevity. Provided that substantially the same result is achieved, the steps of the flowchart shown in FIG. 2 need not be in the exact order shown and need not be contiguous, that is, other steps can be intermediate. The signal adjusting method 200 comprises the following steps:

Step 202: Set the delay time D1 of the delay circuit 102_1_1 as the middle of the delay time provided by the delay circuit 102_1_1, and set the delay times D2-D16 of the delay circuits 102_2_1-102_16_1 as the maximum delay time provided by the delay circuits 102_2_1-102_16_1 respectively;

Step 204: Set the selecting signal S as 1;

Step 206: Utilize the selecting signal S to select one of the transmitted signals Sr2-Sr16 to be the pre-detect output Sn;

Step 208: Generate the plurality of pre-output signals S1-S16 having one cycle to generate the plurality of transmitted signals Sr1-Sr16 having one cycle;

Step 210: Compare the phase difference of the transmitted signal Sr and the pre-detect output Sn;

Step 212: Determine if the transmitted signal Sr1 is leading the pre-detect output Sn or lagging behind the pre-detect output Sn; if the transmitted signal Sr1 is leading the pre-detect output Sn, go to step 214, if the transmitted signal Sr1 is lagging behind the pre-detect output Sn, go to step 216;

Step 214: Reduce a delay time unit upon the delay circuit according to the selecting signal S, go to step 208;

Step 216: Set the selecting signal S=S+1;

Step 218: Determine if the selecting signal S is 16? If yes, go to step 220, if no, go to step 206;

Step 220: Store the delay times D2-D16 of the delay circuits 102_2_1-102_16_1 respectively.

When the signal adjusting system 100 is fabricated, the output signals So1-So16 may have different transmitting times on the signal transmitting paths 104_1-104_16 respectively, therefore causing the different receiving times of the transmitted signals Sr1-Sr16 at the controlling device. In this case, to calibrate the receiving times of the transmitted signals Sr1-Sr16 at the controlling device, the signal generating device 102 first sets the delay time D1 of the delay circuit 102_1_1 as the middle delay time provided by the delay circuit 102_1_1, and the delay control circuit 1022b sets the delay times D2-D16 of the delay circuits 102_2_1-102_16_1 to the maximum delay times provided by the delay circuits 102_2_1-102_16_1 respectively, i.e., step 202. Then, in step 204, the control circuit 1066 sets the selecting signal S as 1 to select the transmitted signal Sr2 of the transmitted signals Sr2-Sr16 to be the pre-detect output Sn. Then, in step 208, the signal generating device 102 generates the plurality of pre-output signals S1-S16 having one cycle to generate the plurality of transmitted signals Sr1-Sr16 having one cycle. Please note that the present invention does not limit the order of performing step 204 and step 208. In other words, steps 204 and 208 can be performed substantially at the same time, or step 208 can be performed first followed by step 204.

When the controlling device 106 receives the transmitted signals Sr1-Sr16, only the transmitted signal Sr1 is selected by the multiplexer 1062 to output the transmitted signal Sr1 (i.e., the pre-detect output Sn) to the phase detector 1064. Then, the phase detector 1064 compares the phase difference between the transmitted signal Sr1 and the pre-detect output Sn (step 210). If the phase of the transmitted signal Sr1 is leading the phase of the pre-detect output Sn, the phase detector 1064 outputs the detected result Sd as 1, i.e., high voltage level. If the phase of the transmitted signal Sr1 is lagging behind the phase of the pre-detect output Sn, the phase detector 1064 outputs the detected result Sd as 0, i.e., low voltage level. Meanwhile, the controlling device 106 transmits the received transmitted signal Sr1 to the control circuit 1066 and the delay circuit 1068. The control circuit 1066 determines the selecting signal S according to the transmitted signal Sr1 and the detected result Sd. Please note that, since the transmitted signal Sr1 received by the control circuit 1066 is then delayed by the delay circuit 1068 by the predetermined delay time Dsyn to generate the triggering signal Ss, the triggering signal Ss will synchronize with the detected result Sd. Then, the triggering signal Ss and the detected result Sd are transmitted to the latch 1022a of the signal generating device 102 via the signal transmitting paths 104_17-104_18 respectively. When the detected result Sd is 1, the control circuit 1066 keeps the selecting signal S intact, i.e., S=1, and the delay control circuit 1022b reduces a delay time unit for the delay time D2 provided by the delay circuit (i.e., the delay circuit 102_2_1) corresponding to the selecting signal S (step 214). When the delay time D2 is reduced by a delay time unit, the phase difference between the transmitted signal Sr2 and the transmitted signal Sr1 may be reduced accordingly in the next cycle. Therefore, by continuously reducing the delay time D2 provided by the delay circuit (i.e., the delay circuit 102_2_1), the detected result Sd will change to 0. Then, the delay time D2 of the delay circuit 102_2_1 can be determined as the final delay time which corresponds to Sd=0.

Then, when the detected result Sd is 0, the control circuit 1066 sets the selecting signal S as S+1, i.e., S=2 (step 216). When the selecting signal S is 2, the multiplexer 1062 selects the transmitted signal Sr3 of the transmitted signals Sr2-Sr16 to be the pre-detect output Sn, and so on. Then, the triggering signal Ss triggers the latch 1022a to transmit the value of the detected result Sd (i.e., the output Sq) to the delay control circuit 1022b. When the detected result Sd is 0, the signal generating device 102 generates the next cycles of the plurality of pre-output signal S1-S16 for transmitting to the controlling device 106 to calibrate the phase difference between the transmitted signal Sr1 and the next transmitted signal, i.e., the transmitted signal Sr3 (step 216). Accordingly, when the delay times D2-D16 of each of the delay circuits 102_2_1-102_16_1 are reset by the control circuit 1022b sequentially, the calibration of the phase differences between the transmitted signal Sr1 and each of the transmitted signals Sr2-Sr16 are completed (step 220).

Please note that the present invention does not limit the number of pre-output signals. In other words, the maximum number of the selecting signal S in step 218 is not limited to 16. 16 is just an example of one embodiment of the present invention. Furthermore, in step 202, the present invention does not limit setting the delay times D2-D16 of the delay circuits 102_2_1-102_16_1 as the maximum respective delay times. In another embodiment of the present invention, the signal generating device 102 sets the delay times D2-D16 of the delay circuits 102_2_1-102_16_1 as the minimum delay times respectively at the beginning of the calibration procedure. Then, the present invention increases a delay time unit for the delay time provided by the delay circuit corresponding to the selecting signal S in step 214. Please note that a person with ordinary skill in the art should readily understand the operation of the above-mentioned embodiment after reading the disclosure of the signal adjusting system 100, and thus the detailed description is omitted here for brevity.

Briefly, the signal adjusting system 100, such as a DDR (Double Data Rate) dynamic random access memory system, of the present invention performs a self-adjusted mechanism to reduce the phase differences between the transmitted signal Sr1-Sr16 received by the controlling device 106 into an acceptable range, in order to solve the problems faced by the related art.

Those skilled in the art will readily observe that numerous modifications and alterations of the device and method may be made while retaining the teachings of the invention.

What is claimed is:

1. A signal adjusting system, comprising:
   a signal generating device, for generating a plurality of output signals according to a plurality of pre-output signals respectively, the plurality of pre-output signals having a first pre-output signal and a plurality of second pre-output signals, the plurality of output signals having a first output signal and a plurality of second output signals;
   a plurality of signal transmitting paths, coupled to the signal generating device, the plurality of signal transmitting paths comprising:
      a first signal transmitting path, for transmitting the first output signal;
      a plurality of second signal transmitting paths, for transmitting the plurality of second output signals respectively; and
      a third signal transmitting path, for transmitting at least one detected result;
   and
   a controlling device, coupled to the plurality of signal transmitting paths, for receiving a first transmitted signal corresponding to the first output signal and receiving a plurality of second transmitted signals corresponding to the plurality of second output signals, and detecting a phase difference between the first transmitted signal and the plurality of second transmitted signals to generate the detected result to the signal generating device, wherein the controlling device comprises:
      a multiplexer, coupled to the plurality of second signal transmitting paths, for selectively outputting one of the plurality of second transmitted signals to generate a pre-detect output according to a selecting signal; and
      a phase detector, coupled to the multiplexer and the first signal transmitting path, for detecting a phase difference between the first transmitted signal and the pre-detect output to generate the detected result;
   wherein the selecting signal is generated according to at least the detected result, and the signal generating device adjusts the phase difference between the first output signal and the plurality of second output signals according to the detected result.

2. The signal adjusting system of claim 1, wherein the controlling device receives the first transmitted signal corresponding to the first output signal and the plurality of second transmitted signals corresponding to the plurality of second output signals respectively, and detects each phase difference between the first transmitted signal and each second transmitted signal of the plurality of second transmitted signals to generate a plurality of detected results corresponding to the plurality of second transmitted signals respectively to the signal generating device, and the signal generating device adjusts each phase difference between the first output signal and each second output signal of the plurality of second output signals according to the plurality of detected results respectively.

3. The signal adjusting system of claim 1, wherein the controlling device further comprises:
   a control circuit, coupled between the phase detector and the multiplexer, for generating the selecting signal.

4. The signal adjusting system of claim 1, wherein the controlling device is further coupled to the first signal transmitting path, and generates the selecting signal according to the detected result generated by the phase detector and the first transmitted signal.

5. The signal adjusting system of claim 1, wherein the signal generating device comprises:
   a first delay processing circuit, for delaying a first delay time upon the first pre-output signal to generate the first output signal;
   a plurality of second delay processing circuits, for delaying a plurality of second delay times upon the plurality of second pre-output signals to generate the plurality of second output signals respectively; and
   a setting device, coupled to the second delay processing circuit, for selectively adjusting the plurality of second delay times according to the detected result.

6. The signal adjusting system of claim 5, wherein the controlling device comprises a delay circuit, coupled to the first signal transmitting path, for delaying a predetermined delay time upon the first transmitted signal to generate a triggering signal, the plurality of signal transmitting paths further comprise a fourth signal transmitting path, for transmitting the triggering signal to the setting device, and the setting device comprises:
   a latch, comprising a data input terminal coupled to the third signal transmitting path, a clock input terminal coupled to the fourth signal transmitting path, and an output terminal; and
   a delay control circuit, coupled to the output terminal of the latch and the plurality of second delay processing circuits, for generating a plurality of adjusting signals according to an output of the latch to selectively adjust the plurality of second delay times respectively.

7. The signal adjusting system of claim 5, wherein each of the delay processing circuits of the first delay processing circuit and the plurality of second delay processing circuits comprises:
   a delay circuit, comprising a first input terminal receiving a pre-output signal, a second input terminal coupled to the setting device, and an output terminal outputting a delayed output signal, the delay circuit delaying a delay time upon the pre-output signal to generate the delayed output signal, and
   a driving circuit, coupled to the delay circuit, comprising an input terminal receiving the delayed output signal and an output terminal outputting an output signal.

8. The signal adjusting system of claim 1, wherein the signal generating device is installed in a memory module.

9. The signal adjusting system of claim 8, wherein the plurality of pre-output signals are DQ signals of the memory module.

10. The signal adjusting system of claim 1, wherein the controlling device is installed in a memory controller.

11. A signal adjusting method, comprising:
    generating a plurality of output signals according to a plurality of pre-output signals respectively, the plurality of pre-output signals having a first pre-output signal and a plurality of second pre-output signals, the plurality of output signals having a first output signal and a plurality of second output signals;
    providing a plurality of signal transmitting paths, the plurality of signal transmitting paths comprising:
       a first signal transmitting path, for transmitting the first output signal;
       a plurality of second signal transmitting paths, for transmitting the plurality of second output signals respectively; and
       a third signal transmitting path, for transmitting at least one detected result;
    receiving a first transmitted signal corresponding to the first output signal and receiving a plurality of second transmitted signals corresponding to the plurality of second output signals from the first signal transmitting path, and detecting a phase difference between the first transmitted signal and the plurality of second transmitted signals to generate the detected result,
wherein the step of generating the detected result comprises:
selectively outputting one of the plurality of second transmitted signals to generate a pre-detect output according to a selecting signal; and
detecting a phase difference between the first transmitted signal and the pre-detect output to generate a detected result; and
receiving the detected result from the third signal transmitting path, and adjusting the phase difference between the first output signal and the plurality of second output signals according to the detected result;
wherein the selecting signal is generated according to at least the detected result.

12. The signal adjusting method of claim 11, wherein the step of generating the detected result comprises:
receiving the first transmitted signal corresponding to the first output signal and the plurality of second transmitted signals corresponding to the plurality of second output signals respectively, and detecting each phase difference between the first transmitted signal and each second transmitted signal of the plurality of second transmitted signals to generate a plurality of detected results corresponding to the plurality of second transmitted signals respectively; and
the step of adjusting the phase difference between the first output signal and the plurality of second output signals according to the detected result comprises:
adjusting each phase difference between the first output signal and each second output signal of the plurality of second output signals according to the plurality of detected results respectively.

13. The signal adjusting method of claim 11, wherein the step of generating the detected result further comprises:
generating the selecting signal according to the first transmitted signal and the detected result.

14. The signal adjusting method of claim 11, wherein the step of generating the plurality of output signals comprises:
delaying a first delay time upon the first pre-output signal to generate the first output signal;
delaying a plurality of second delay times upon the plurality of second pre-output signals to generate the plurality of second output signals respectively; and
selectively adjusting the plurality of second delay times according to the detected result.

15. The signal adjusting method of claim 14, wherein the step of receiving the first transmitted signal and the plurality of second transmitted signals comprises delaying a predetermined delay time upon the first transmitted signal to generate a triggering signal, the plurality of signal transmitting paths further comprise a fourth signal transmitting path for transmitting the triggering signal, and the step of selectively adjusting the plurality of second delay times comprises:
utilizing a latch to receive the detected result and the triggering signal for generating an adjusting signal; and
selectively adjusting the plurality of second delay times according to the plurality of adjusting signals respectively.

16. The signal adjusting method of claim 11, wherein the step of generating the plurality of output signals is accomplished in a memory module.

17. The signal adjusting method of claim 16, wherein the plurality of pre-output signals are DQ signals of the memory module.

18. The signal adjusting method of claim 11, wherein the step of generating the detected result is accomplished in a memory controller.

19. A signal adjusting system, comprising:
a signal generating device, for generating a plurality of output signals according to a plurality of pre-output signals respectively, the plurality of pre-output signals having a first pre-output signal and at least one second pre-output signal, the plurality of output signals having a first output signal and at least one second output signal;
a plurality of signal transmitting paths, coupled to the signal generating device, the plurality of signal transmitting paths comprising:
a first signal transmitting path, for transmitting the first output signal;
at least one second signal transmitting path, for transmitting the second output signal; and
a third signal transmitting path, for transmitting at least one detected result; and
a controlling device, coupled to the plurality of signal transmitting paths, for receiving a first transmitted signal corresponding to the first output signal and receiving a second transmitted signal corresponding to the second output signal, and detecting a phase difference between the first transmitted signal and the second transmitted signal to generate the detected result to the signal generating device;
wherein the signal generating device adjusts the phase difference between the first output signal and the second output signal according to the detected result, the signal generating device comprises:
a first delay processing circuit, for delaying a first delay time upon the first pre-output signal to generate the first output signal;
at least one second delay processing circuit, for delaying a second delay time upon the second pre-output signal to generate the second output signal; and
a setting device, coupled to the second delay processing circuit, for selectively adjusting the second delay time according to the detected result; and
the controlling device comprises a delay circuit, coupled to the first signal transmitting path, for delaying a predetermined delay time upon the first transmitted signal to generate a triggering signal, the plurality of signal transmitting paths further comprise a fourth signal transmitting path, for transmitting the triggering signal to the setting device, and the setting device comprises:
a latch, comprising a data input terminal coupled to the third signal transmitting path, a clock input terminal coupled to the fourth signal transmitting path, and an output terminal; and
a delay control circuit, coupled to the output terminal of the latch and the second delay processing circuit, for generating an adjusting signal according to an output of the latch to selectively adjust the second delay time.

20. A signal adjusting method, comprising:
generating a plurality of output signals according to a plurality of pre-output signals respectively, the plurality of pre-output signals having a first pre-output signal and at least one second pre-output signal, the plurality of output signals having a first output signal and at least one second output signal;
providing a plurality of signal transmitting paths, the plurality of signal transmitting paths comprising:

a first signal transmitting path, for transmitting the first output signal;

at least one second signal transmitting path, for transmitting the second output signal; and a third signal transmitting path, for transmitting at least one detected result;

receiving a first transmitted signal corresponding to the first output signal and receiving a second transmitted signal corresponding to the second output signal from the first signal transmitting path, and detecting a phase difference between the first transmitted signal and the second transmitted signal to generate the detected result; and receiving the detected result from the third signal transmitting path, and adjusting the phase difference between the first output signal and the second output signal according to the detected result;

wherein the step of generating the plurality of output signals comprises:

delaying a first delay time upon the first pre-output signal to generate the first output signal;

delaying a second delay time upon the second pre-output signal to generate the second output signal; and selectively adjusting the second delay time according to the detected result;

the step of receiving the first transmitted signal and the second transmitted signal comprises delaying a predetermined delay time upon the first transmitted signal to generate a triggering signal, the plurality of signal transmitting paths further comprise a fourth signal transmitting path for transmitting the triggering signal, and the step of selectively adjusting the second delay time comprises:

utilizing a latch to receive the detected result and the triggering signal for generating an adjusting signal; and selectively adjusting the second delay time according to the adjusting signal.

* * * * *